United States Patent
Kim et al.

(10) Patent No.: US 6,528,418 B1
(45) Date of Patent: Mar. 4, 2003

(54) MANUFACTURING METHOD FOR SEMICONDUCTOR DEVICE

(75) Inventors: Jeong Ho Kim, Kyoungki-do (KR); Jae Seon Yu, Kyoungki-do (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 0 days.

(21) Appl. No.: 09/957,094

(22) Filed: Sep. 20, 2001

(51) Int. Cl.[7] .............................................. H01L 21/44
(52) U.S. Cl. ........................ 438/672; 438/675; 438/299
(58) Field of Search ................................ 438/672, 675, 438/299, 631

(56) References Cited

U.S. PATENT DOCUMENTS

| | | | | |
|---|---|---|---|---|
| 6,187,624 B1 | * | 2/2001 | Huang | 438/253 |
| 6,352,896 B1 | * | 3/2002 | Liu et al. | 438/253 |
| 6,387,759 B1 | * | 5/2002 | Park et al. | 438/275 |
| 6,423,627 B1 | * | 7/2002 | Carter et al. | 438/233 |
| 6,448,179 B2 | * | 9/2002 | Kim et al. | 438/239 |

* cited by examiner

Primary Examiner—Trung Dang
(74) Attorney, Agent, or Firm—Marshall, Gerstein & Borun

(57) ABSTRACT

A method for manufacturing a semiconductor device is disclosed. In a method for forming a contact plug according to a high integration of a semiconductor device, the method for manufacturing a semiconductor device leaves a low dielectric insulating film as a release film in a bit line contact and a storage electrode contact region of an upper semiconductor substrate where a MOSFET is provided, forms a contact plug which buries a spacing between the bit line contact and the storage electrode contact region, forms a contact plug without damaging a lower layer by removing the release layer, and solves a misalignment problem that occurs during a photolithography process and solves a problem in obtaining a contact area by a slope etching profile that occurs during the etching process, thereby providing an improved process margin.

14 Claims, 6 Drawing Sheets

MANUFACTURING METHOD FOR SEMICONDUCTOR DEVICE

BACKGROUND

1. Technical Field

The present invention relates to a semiconductor device, and more particularly, to a method for manufacturing a semiconductor device which forms a contact plug in predetermined regions of the bit line contact and the storage electrode contact of a highly integrated semiconductor device.

2. Background of the Related Art

The high integration of a semiconductor device requires a micro-pattern forming technique and a micro-pattern processing of a photoresist which is widely used as a mask in an etching process or in an ion-implanting process.

A resolution R of the photoresist film pattern representing a micro degree is proportional to a wavelength ($\lambda$) of light source of a stepper and a process parameter (k), and is inversely proportional to a lens diameter NA (numerical aperture) of a stepper as shown in the following equation.

$$R=k*\lambda/NA, \text{ where R=resolution, } \lambda=\text{wavelength of light source and NA=numerical aperture.} \quad \text{Equation 1}$$

The wavelength $\lambda$ of the light source can be reduced or other process methods can be performed to improve the resolution of the stepper.

First, in order to reduce the Resolution by reducing the wavelength of the stepper so that the process Resolution has limitations of 0.7 $\mu$m and 0.5 $\mu$m respectively by using a G-line and an I-line steppers having wavelengths of 436 nm and 365 nm respectively, and in order to form micro pattern with a Resolution below 0.5 $\mu$m, a stepper is used that has a deep ultra violet light source (DUV) having a short wavelength, for example a KrF laser having a wavelength of 248 nm or an ArF laser having a wavelength of 193 nm.

Also, other methods for reducing the Resolution include: using a phase shift mask instead of a photo mask; employing a contrast enhancement layer (CEL) method in which a separate thin film capable of enhancing an image contrast is formed on an wafer; using a tri layer resist (TLR) method in which an intermediate layer such as Spin-On-Glass (SOG) film is disposed between two photoresist films; and employing a silylation method in which a gas containing silicon is selectively injected on an upper portion of the photoresist films.

Meanwhile, as a semiconductor device becomes highly integrated, the size of a contact hole which connects upper and lower conductor wirings is decreased, the spacing between the contact hole and an adjacent wiring is decreased, and the aspect ratio which is a ratio between a diameter and a depth of the contact hole is increased.

Accordingly, in a highly integrated semiconductor device having multi-layered conductor wirings, in order to form a contact hole, the masks must be aligned precisely one with another during manufacturing processes of the semiconductor device because the process margin is minimized.

In order to maintain a proper spacing between contact holes, any misalignment tolerance when aligning a mask must be minimized, any lens distortion when implementing an exposing process must be minimized, the critical dimension variation when preparing masks and implementing photo lithography processes must be minimized, and the registration between masks must be maximized.

However, it is difficult to form a contact hole in a predetermined region even if a mask is used. Therefore, to overcome this limitation, a self-aligned contact (SAC) technology which forms a contact hole by a self-aligned method is used.

While a polysilicon, a nitride film or an oxidized film can be used can be used as an etching barrier layer in the SAC method, a nitride film is mainly used as an etch barrier.

Although not shown in drawings, a method for manufacturing a conventional semiconductor device using the SAC technology will be explained.

First, a predetermined lower structure, for example, a MOS field effect transistor (MOSFET) having a field oxide and a gate insulating film, and a gate electrode overlapped with a mask oxide film pattern, source/drain regions, etc. are formed on a semiconductor substrate. Then, an etch barrier and an interlayer insulation film made of an oxide film are sequentially formed on an entire surface of the structure.

Subsequently, a photoresist pattern is formed which exposes an interlayer insulation film in a predetermined region of a bit line contact and a storage electrode contact in the semiconductor substrate. The interlayer insulation film exposed by the photoresist pattern is etched by dry etching so as to expose the etch barrier, and a contact hole is formed by etching the etch barrier again.

However, according to the conventional method for manufacturing a semiconductor device, in the case of forming a bit line contact and a storage electrode contact of a device having a design rule of no greater than 0.15 $\mu$m, the conventional circle-type contact is problematic in terms of obtaining a contact hole due to misalignment caused by the lithography process. Therefore, it is impossible for such a contact hole to be applied to manufacturing of semiconductor devices.

In order to overcome this, a method is proposed in which an oxide film which is an interlayer insulation film is formed, and the oxide film is etched by using a T-type or I-type contact mask having the same type as an active region, then a conductive layer for a contact plug is then formed and polished using a chemical mechanical polishing (CMP) to form a contact plug.

Although a method for manufacturing the contact plug using the T-type contact mask has enough of a margin for a bit line contact misalignment, it is difficult to obtain a contact region in a device having a design rule of no greater than 0.13 $\mu$m due to misalignment in the region where the storage electrode contact is formed and a slope profile generated when the oxide film is etched.

Also, it is very difficult to obtain a high selection ratio for a nitride film using a method for manufacturing the contact plug using the I-type contact mask where the oxide film is etched by shifting a device isolation mask on a device isolation film since the etched area is wider than the mask area.

Generally, the etched area should be smaller than the non-etched area to obtain a high selection ratio for a nitride film when the oxide film is etched. This is because a polymer cannot protect a nitride film when the etched area is larger than the non-etched area.

In addition, the T-type or I-type processes have a problem in that contact resistance and junction leakage current increase because the etching process is performed in an active region of a semiconductor substrate. As a result, the active region of the semiconductor substrate is exposed to a plasma when the oxide film is etched and the region is damaged by the plasma.

SUMMARY OF THE DISCLOSURE

Accordingly, a method for manufacturing a semiconductor device is disclosed that substantially overcomes one or more of the above-described problems due to limitations and disadvantages of the related art.

A method for manufacturing a semiconductor device is disclosed which etches a low dielectric material without damaging a semiconductor substrate and which improves the characteristics of contact resistance and current leakage by forming a low dielectric material pattern in the region where a contact plug will be formed by etching a low dielectric material of an isolation film for insulation between contact plugs, by insulating between contact plugs with an insulting interlayer, and by removing the low dielectric material pattern to form a contact plug.

A method for manufacturing a semiconductor device is disclosed which includes the steps of: forming a field oxide layer in a field region of a semiconductor substrate and a MOSFET in an active region of the substrate, wherein a mask insulating film pattern is formed on an upper portion of a gate electrode of the MOSFET and an insulation film spacer is formed on a sidewall of the gate electrode; forming a stack structure of a low dielectric release insulating film pattern which protects a bit line contact and a storage electrode contact and a hard mask layer on the resultant surface; forming an interlayer insulating film in an upper portion of an entire surface and etching the interlayer insulating film and the hard mask layer, thereby exposing the low dielectric release insulating film pattern; removing the exposed low dielectric release insulating film pattern; forming a conductive layer for a contact plug on the entire surface of the resultant; and forming a contact plug by planarization etching process using the mask insulating film pattern as an etch barrier.

A stack structure is formed of a low dielectric release insulating the film pattern and a hard mask layer to protect predetermined regions of the bit line contact and the storage electrode contact in the upper semiconductor substrate where the MOSFET is formed with a T-type or a I-type contact mask, to form an interlayer insulating film which fills a spacing of the stack structure in an upper portion of the entire surface, to planarize, to expose the contact regions by removing the low dielectric release insulating film pattern, and to form a contact plug by forming a conductive layer for a contact plug which fills the exposed contact regions.

Accordingly, a contact plug is formed by obtaining contact regions with a low dielectric release insulating film pattern and filling the regions resulting from removing the low dielectric release insulating film pattern with a conductive layer.

It is to be understood that both the foregoing general description and the following detailed description of the disclosed methods and structures are exemplary and explanatory and are intended to provide further explanation of the invention as claimed.

The accompanying drawings, which are included to provide a further understanding of the disclosure are incorporated in and constitute a part of this application, illustrate various embodiments of the disclosure and together with the description serve to explain the principles of the disclosure.

DETAILED DESCRIPTION OF THE PRESENTLY PREFERRED EMBODIMENTS

Reference will now be made in detail to the preferred embodiments, examples of which are illustrated in the accompanying drawings.

Figure 1:
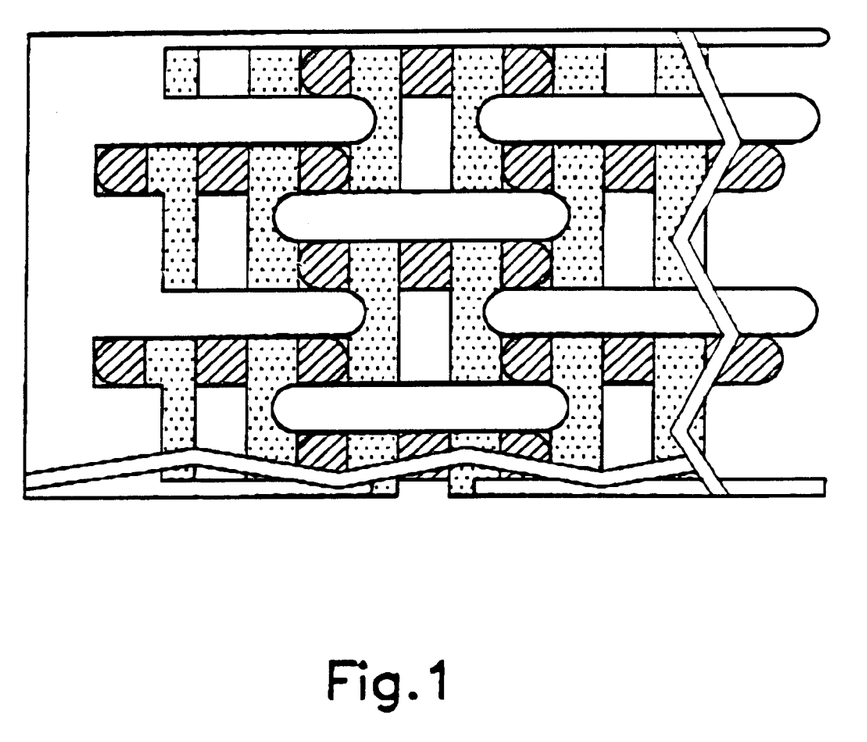
FIG. 1 illustrates, schematically, a manufacturing method for a semiconductor device according to the disclosure.
Figure 2A:
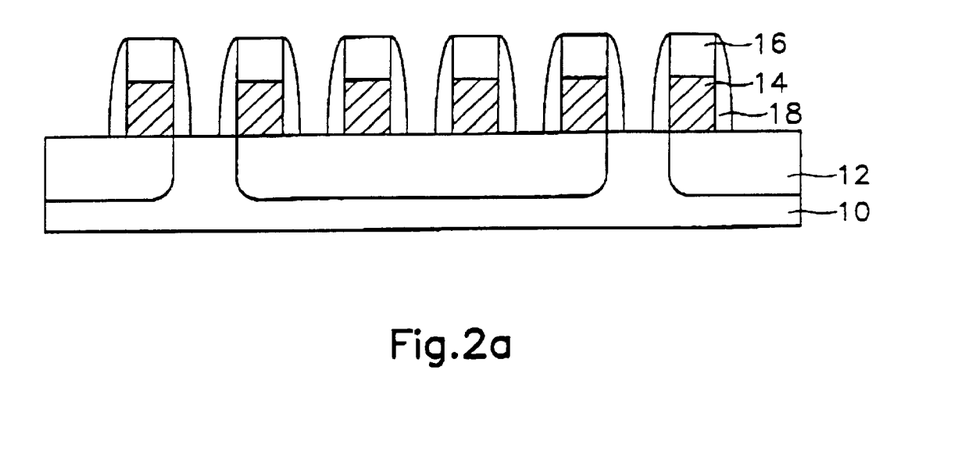
FIGS. 2a to 2i are sectional views illustrating a manufacturing method for a semiconductor device according to FIG. 1.

First, referring to FIG. 2a, an isolation film 12 is formed in a predetermined region of the semiconductor substrate 10 as an isolation region, and a gate insulating film (not shown) is formed in an upper portion of the surface of the substrate 10.

Then, a conductive layer for a gate electrode (not shown) and a mask insulating film (not shown) are formed in an upper portion of the gate insulating film. The stack structure is etched by a photo lithography process using a gate electrode mask to form a gate electrode 14 and a mask insulating film pattern 16. The mask insulating film is formed by using one selected from a group of SiN film, SiON film rich in Si (e.g., SRON film), a $Al_2O_3$ film and $Ta_2O_5$ film. The etching process forms an etching profile vertically by using a gas mixture of $CF_4/O_2/Ar$ or $CHF_3/O_2/Ar$.

Subsequently, an insulating film is formed in an upper portion of the gate electrode 14 and is etched to form an insulating film spacer 18 on a sidewall of the gate electrode 14 and the mask insulating film pattern 16. At this time, the insulating film spacer 18 comprises a SiN film. The insulating film spacer 18 can comprise an oxide film, another nitride film, or an oxide nitride film.

Although not shown in drawings, a source/drain region is formed to provide an electric field effect transistor by implanting lightly doped and highly doped impurity ions before and after the insulating film spacer 18 is formed.

Figure 2B:
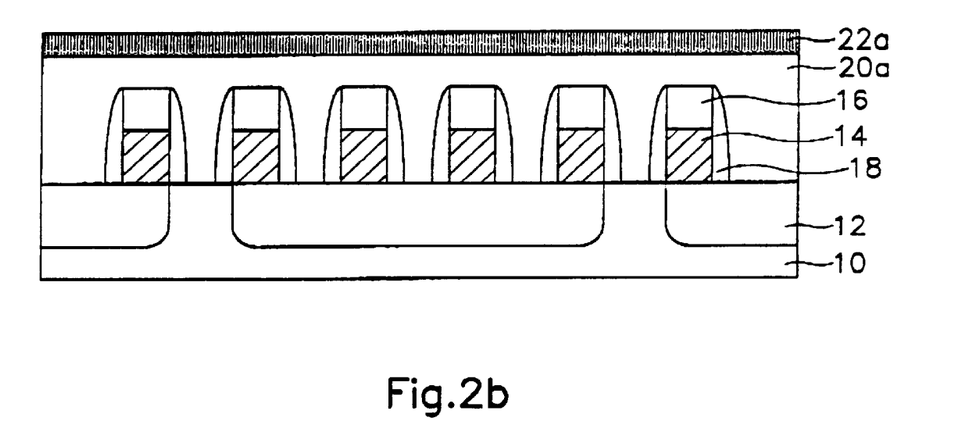

Referring now to FIG. 2b, a low dielectric release insulating film 20a is formed on an upper portion of the surface, and a thin film 22a for a hard mask is formed with a predetermined thickness on an upper portion of the low dielectric release insulating film 20a. The low dielectric release insulating film 20a is formed by using material selected optionally from a group of organic matter such as Silk, Flare, Velok, Cytop, Alcap, BCB, and FlowFill and SiC. The thin film 22a for a hard mask is formed from an oxide film.

Figure 2C:
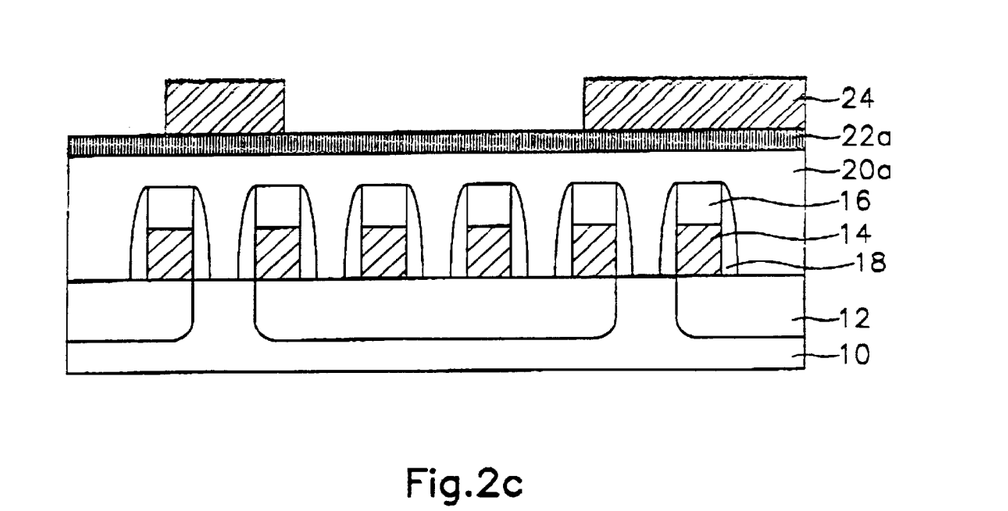

Subsequently, as shown in FIG. 2c, a photoresist pattern 24 is formed which protects the upper thin hard mask film 22a. The photoresist pattern 24 is formed at an upper portion of a region where a contact plug will be formed in the semiconductor substrate 10. The photoresist pattern 24 is formed with an I-type or a T-type contact mask.

Figure 2D:
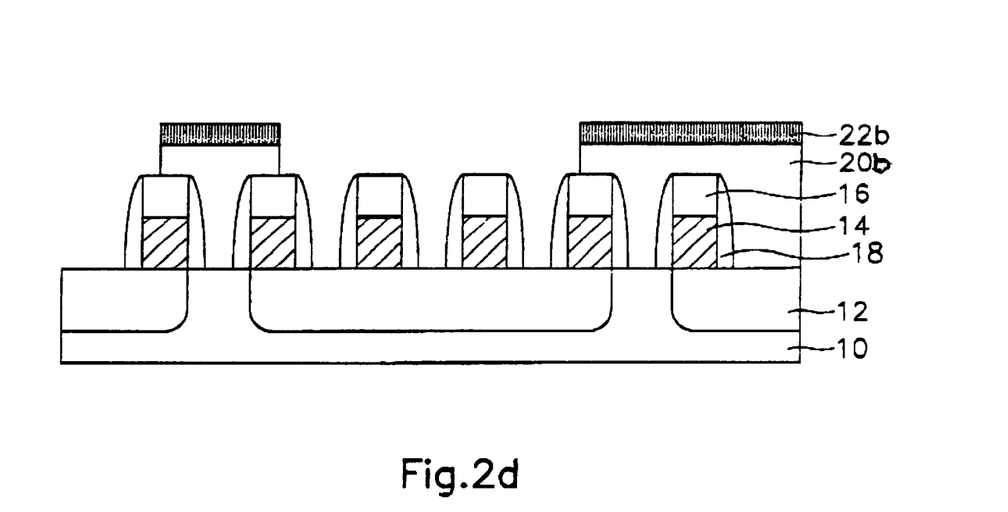

Then, as shown in FIG. 2d, a low dielectric release insulating pattern 20b and a hard mask 22b stack structure are formed which protect a region where a contact plug will be formed are formed. The hard mask 22b is formed using the photoresist pattern 24 as a mask. The photoresist pattern 24 is then removed and the low dielectric insulating pattern 20b is formed using the hard mask 22b as a mask. The low dielectric release insulating pattern 20b is formed by an etching process using the hard mask 22b as an etching mask.

At this time, the etching process enhances an etching selection ratio for the insulating film spacer 18 and the mask insulating film pattern 16 in a lower portion of the low dielectric release insulating film 20a and improves an etching profile by mixing a first etching gas which includes oxygen, such as $O_2$, $NO_2$, $N_2$, $SO_2$, CO, and $CO_2$ with a second etching gas which includes hydrogen, such as $N_2H_2$, $NH_3$, and $C_2H_4$. Also, an inactive gas such as He, Ne, Ar, and Xe or $N_2$ gas can be mixed as a third etching gas to improve a uniformity of plasma, to control an etching profile, or to control an etching speed.

Figure 2E:
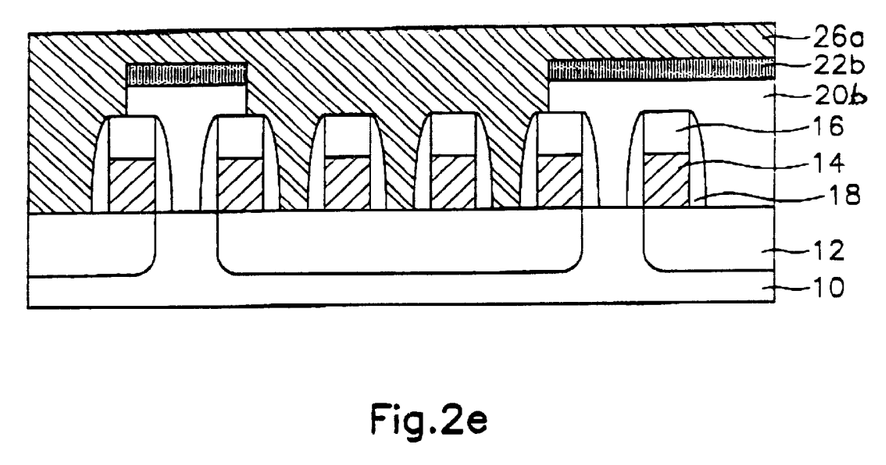

Subsequently, as shown in FIG. 2e, an insulating interlayer 26a is formed at an upper portion of an entire surface. At this time, the insulating interlayer 26a is formed by using a dielectric material such as an oxide film, a nitride film, and an oxidized nitride film.

Figure 2F:
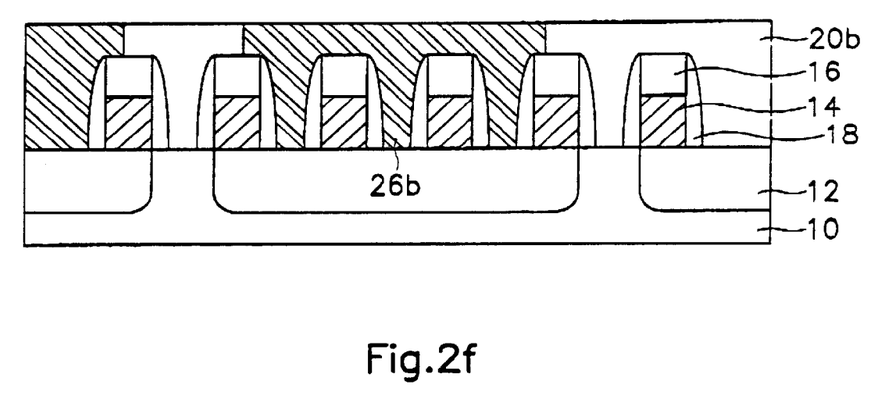

Then, as shown in FIG. 2f, the low dielectric release insulating film pattern 20b is exposed by removing the insulating interlayer 26a and the hard mask 22b with a chemical mechanical polishing or etching of the entire surface. An insulating interlayer pattern 26b is formed between the low dielectric release insulating film pattern 20b.

Figure 2G:
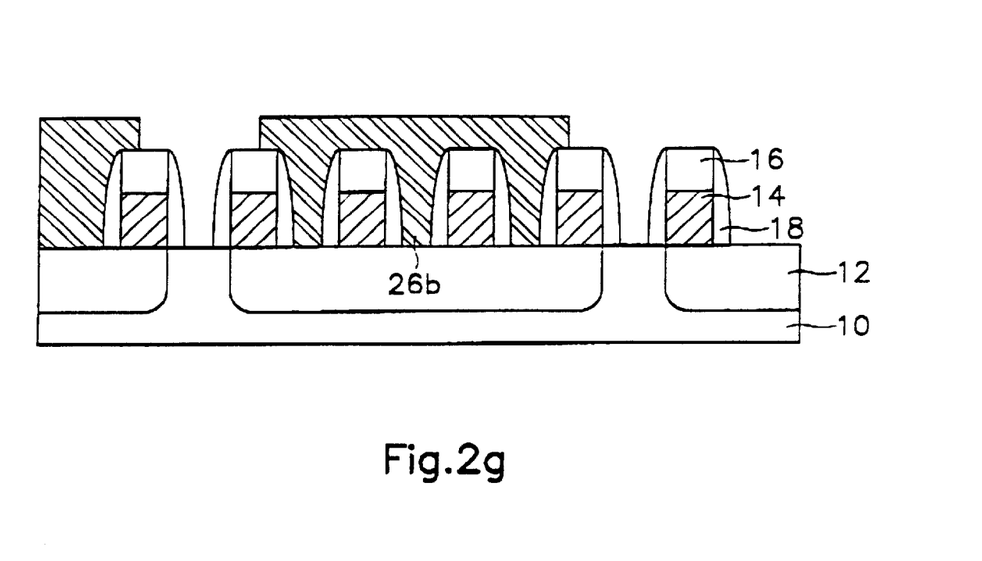

Subsequently, as shown in FIG. 2g, the low dielectric release insulating film pattern 20b is removed. At this time, the low dielectric release insulating film pattern 20b is removed by a wet etching process using a mixture of $H_2O_2$, $H_2SO_4$ and deionized water or it is removed by an isotropic dry etching process using etching gas used in the etching process of FIG. 2d.

Figure 2H:
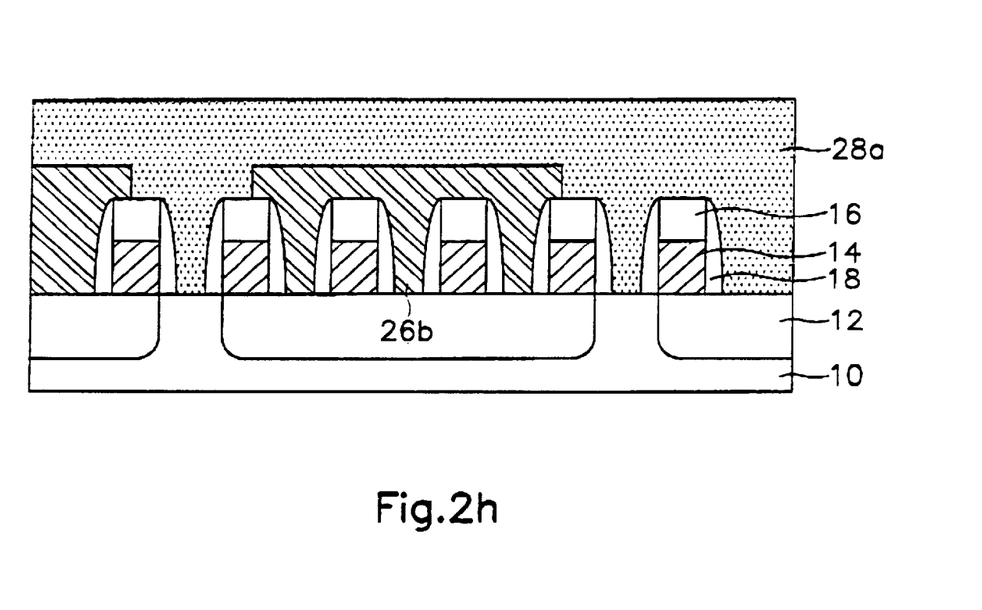

Then, as shown in FIG. 2h, a conductive layer 28a for contact plugs is formed in an upper portion of an entire surface. The conductive layer 28a for contact plugs is formed using a polysilicon layer, a tungsten film layer, a tungsten layer formed selectively, Ti/TiN film, or a polysilicon layer formed by a selective epitaxial growth. At this time, in case that the conductive layer 28a for a contact plug is formed of a polysilicon layer of a selective epitaxial growth, a subsequent planarization etching process can be omitted.

Figure 2I:
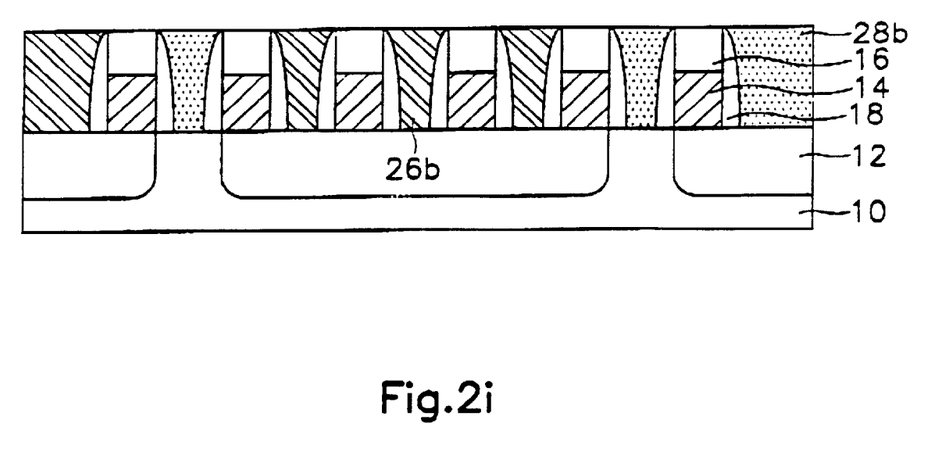

Subsequently, as shown in FIG. 2i, a contact plug 28b contacting the semiconductor substrate 10 is formed by planarizing the conductive layer 28a for a contact plug with a chemical mechanical polishing or etching of an entire surface using the mask insulating film pattern 16 as an etching barrier layer. Meanwhile, in case that the conductive layer 28a for a contact plug is removed by etching of an entire surface, a gas containing fluorine, such as $CF_4$, $NF_3$, $SF_3$, $C_2F_4$ and $C_2F_6$, or a gas containing halogen, such as $Cl_2$, $BCl_3$, HI, and HBr are used as a first etching gas, and a gas containing oxygen, such as $O_2$, NO, $SO_2$, CO, and $CO_2$, or $N_2$ gas are used as a second etching gas. Also, an inactive gas such as He, Ne, Ar or Xe is used as a third etching gas to stabilize the plasma, to increase a sputter effect, and to improve an etch-stop phenomenon, thereby improving properties of the semiconductor device. (See FIG. 2i.)

The disclosed method prevents a nitride film deposited in a sidewall or an upper portion of a gate electrode from being damaged by etching a low dielectric material used as a release insulating film in a manufacturing process of a contact plug of a highly integrated semiconductor device on an interlayer insulation film, prevents a semiconductor substrate from bring damaged, thereby improving contact resistance and reducing leakage current. Also, a misalignment problem occurring during a photo process and difficulty in obtaining a contact area due to a slope etching profile are solved thereby improving the process margin.

The forgoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed:

1. A method for manufacturing a semiconductor device comprises:

providing a semiconductor substrate comprising a field region and an active region;

forming field oxide layer in field region of the semiconductor substrate and a MOSFET in the active region of the semiconductor substrate, the MOSFET comprising a gate electrode that comprises a sidewall and an upper portion;

forming a mask insulating film pattern on the upper portion of the gate electrode and on the sidewall of the gate electrode;

forming a stack structure comprising a low dielectric release insulating film pattern on the mask insulating film and a hard mask layer on the low dielectric release insulating film;

forming an interlayer insulating film on the hard mask layer and etching the interlayer insulating film and the hard mask layer, thereby exposing the low dielectric release insulating film pattern;

removing the exposed low dielectric release insulating film pattern;

forming a conductive layer for a contact plug on the entire surface of the substrate; and forming a contact plug by planarization etching process using the mask insulating film pattern as an etch barrier.

2. The method as claimed in claim 1, wherein the mask insulating film pattern comprises a material selected from the group consisting of SiN film, SiON film, SiON film rich in Si, $Al_2O_3$ film and $Ta_2O_5$ film.

3. The method as claimed in claim 1, wherein the mask insulating film pattern is formed by using a mixture gas comprising $CF_4$, $O_2$, and Ar as an etching gas.

4. The method as claimed in claim 1, wherein the mask insulating film pattern is formed by using a mixture gas comprising $CHF_3$, $O_2$, and Ar as an etching gas.

5. The method as claimed in claim 1, wherein the insulating film spacer comprises a film selected from the group consisting of a nitride film, an oxide film, or an oxide nitride film.

6. The method as claimed in claim 1, wherein the low dielectric release insulating film comprises one of an organic matter selected from the group consisting of an Silk, Flare, Velok, Cytop, Alcap, BCB, and FlowFill, or in the alternative, SiC.

7. The method as claimed in claim 1, wherein the hard mask layer is an oxide film.

8. The method as claimed in claim 1, wherein the removing of the low dielectric release insulating film pattern is performed by using a mixture gas of oxygen and hydrogen as an etching gas.

9. The method as claimed in claim 1, wherein the removing of the low dielectric release insulating film pattern is performed by using a mixture gas which comprises (i) oxygen, (ii) hydrogen, and (iii) at least one of an active gas and $N_2$ gas.

10. The method as claimed in claim 1, wherein the low dielectric release insulating film pattern is removed by a wet etching process using a mixture solution comprising $H_2O_2$, $H_2SO_4$, and deionized water.

11. The method as claimed in claim 1, wherein the conductive layer for a contact plug is formed from a material selected from the group consisting of a polysilicon layer, a tungsten film, a selective-grown tungsten film, and a silicon layer formed by selective epitaxial growth.

12. The method as claimed in claim 11, wherein the planarization etching process is omitted in case that the conductive layer for a contact plug is formed of a selective-grown tungsten film or a silicon layer formed by selective epitaxial growth.

13. The method as claimed in claim 11, wherein the planarization etching process is performed using an etching gas comprising (i) a first gas selected from the group consisting of fluorine, halogen, and mixture thereof (ii) a second gas selected from the group consisting of oxygen, $N_2$ and mixtures thereof, and (iii) inactive gas as a third gas in case that the conductive layer for a contact plug is formed of the polysilicon layer, the selective-grown tungsten layer or the Ti/TiN layer.

14. A semiconductor device made in accordance with the method of claim 1.

* * * * *